United States Patent
Todd et al.

(10) Patent No.: US 12,379,412 B2
(45) Date of Patent: Aug. 5, 2025

(54) RADIATION ANOMALY CHARACTERIZATION SYSTEM

(71) Applicant: Hamilton Sundstrand Space Systems International, Inc., Windsor Locks, CT (US)

(72) Inventors: Joshua Todd, Tolland, CT (US); Gabriel Fletcher, Colchester, CT (US)

(73) Assignee: HAMILTON SUNDSTRAND SPACE SYSTEMS INTERNATIONAL, INC., Windsor Locks, CT (US)

( * ) Notice: Subject to any disclaimer, the term of this patent is extended or adjusted under 35 U.S.C. 154(b) by 307 days.

(21) Appl. No.: 18/296,598

(22) Filed: Apr. 6, 2023

(65) Prior Publication Data

US 2024/0337684 A1 Oct. 10, 2024

(51) Int. Cl.
G01R 31/28 (2006.01)
G01T 1/02 (2006.01)
H03K 19/003 (2006.01)

(52) U.S. Cl.
CPC .......... *G01R 31/2872* (2013.01); *G01T 1/026* (2013.01); *H03K 19/0033* (2013.01)

(58) Field of Classification Search
None
See application file for complete search history.

(56) References Cited

U.S. PATENT DOCUMENTS

| | | | |
|---|---|---|---|
| 4,970,391 A * | 11/1990 | Uber, III | H01J 47/02 250/374 |
| 7,428,473 B2 | 9/2008 | Rodriguez et al. | |
| 8,361,829 B1 * | 1/2013 | Gordon | H01L 21/76243 438/57 |
| 8,791,418 B2 * | 7/2014 | Visconti | G01T 1/00 250/370.07 |
| 9,747,996 B2 | 8/2017 | Kay et al. | |
| 10,305,478 B1 | 5/2019 | Zubkow et al. | |
| 10,509,132 B1 * | 12/2019 | Ray | G01T 1/026 |
| 10,797,701 B2 | 10/2020 | Zubkow et al. | |
| 10,878,922 B1 * | 12/2020 | Ray | G11C 5/005 |
| 11,188,421 B2 | 11/2021 | Weinmann et al. | |
| 11,205,031 B2 | 12/2021 | Huang et al. | |
| 2015/0237419 A1 * | 8/2015 | Lee | H04Q 9/00 340/870.02 |

* cited by examiner

Primary Examiner — Marcus H Taningco
(74) Attorney, Agent, or Firm — CANTOR COLBURN LLP

(57) ABSTRACT

A system for detecting radiation events, having: a test memory with memory blocks; a controller having controller memory; an integrated circuit (IC) array having IC chains, wherein each of the IC chains has a plurality of IC elements that is response to and generates a voltage when exposed to a radiation event; a dosimeter configured to record an accumulated amount of radiation exposure to the system, wherein the controller is configured to perform steps of: initializing the test memory, the IC array and the dosimeter; monitoring for an unexpected signal from an IC chain and for unexpected data in a memory block of the test memory; and identifying the radiation event upon one or more of receiving the unexpected signal and identifying unexpected data in a memory block of the test memory.

15 Claims, 7 Drawing Sheets

RADIATION ANOMALY CHARACTERIZATION SYSTEM

BACKGROUND

The embodiments are directed to radiation detection systems and more specifically to a radiation anomaly characterization system that includes radiation hardened and non-radiation hardened sensing components.

Radiation shielding generally refers to thermal shielding, biological shielding, or instrument shielding. Instrument shielding protects electronic components from the effects of radiation. Electronic components housed within a spacecraft may experience radiation from protons and electrons trapped near the Earth's surface, solar particles, or galactic cosmic rays that are generally filtered by the earth's atmosphere and, thus, are not a concern in terrestrial applications. A total ionizing dose (TID), which is an absorbed dose in a given material (e.g., silicon) due to energy deposition of ionizing radiation, and a total nonionizing dose (TNID), which results in cumulative parametric degradation that can lead to the failure of components, can result from the radiation. The radiation environments on astronomical objects such as the Lunar and Martian surfaces have been characterized by a statistical model. Sudden abnormal radiation events may cause device malfunctions and potential mission interruptions. Monitoring and characterization of Single Event Effects (SEEs) and TIDs are established on Earth. Long duration Extra Vehicular Activities (EVAs) and radiation exposure can be hazardous so that a characterizing a surface exposure limits on astronomical objects is desirable.

BRIEF SUMMARY

Disclosed is a system for detecting radiation events, including: a test memory having memory blocks; a controller having controller memory; an integrated circuit (IC) array having IC chains, wherein each of the IC chains has a plurality of IC elements that is response to and generates a voltage when exposed to a radiation event; a dosimeter configured to record an accumulated amount of radiation exposure to the system, wherein the controller is configured to perform steps of: initializing the test memory, the IC array and the dosimeter; monitoring for an unexpected signal from an IC chain and for unexpected data in a memory block of the test memory; and identifying the radiation event upon one or more of receiving the unexpected signal and identifying unexpected data in a memory block of the test memory.

In addition to one or more aspects of the system, or as an alternate, each of the IC chains includes: an input comparator; an output comparator; and a plurality of buffers connected in series between the input and output comparators.

In addition to one or more aspects of the system, or as an alternate, the system further includes a substrate having first and second sides, and the IC chains are disposed on the first and second sides of the substrate.

In addition to one or more aspects of the system, or as an alternate, the IC array include radiation hardened (rad-hard) IC chains and non-rad-hard IC chains that are positioned on the first and second sides of the substrate.

In addition to one or more aspects of the system, or as an alternate, the rad-hard IC chains and the non-rad-hard IC chains alternate at least on a first side of the substrate.

In addition to one or more aspects of the system, or as an alternate, the rad-hard IC chains and the non-rad-hard IC chains are configured in a first alternating pattern on the first side of the substrate and a second alternating pattern on the second side of the substrate, where the first and second alternating patterns are either opposite each other or are the same as each other.

In addition to one or more aspects of the system, or as an alternate, upon identifying the radiation event, the controller is configured to perform steps of: polling the dosimeter for a cumulative total radiation exposure to the system; updating system counter data in the controller memory to a cumulative total observed radiation events; and storing in the controller memory a data-record including a timestamp of the radiation event and the cumulative total radiation exposure to the system.

In addition to one or more aspects of the system, or as an alternate, when monitoring for unexpected signals from the IC array, the controller is configured to perform steps of: setting a watch dog timer (WDT) to wait for signal anomalies; and monitoring for receipt of the unexpected signal from the IC array.

In addition to one or more aspects of the system, or as an alternate, upon identifying the radiation event, the controller is configured to perform steps of: testing an integrity of the IC array; and upon verifying the integrity of the IC array, updating an IC array counter data in the controller memory corresponding to the IC chain exposed to the radiation event, otherwise deactivating the IC chain exposed to the radiation event, and not updating the IC array counter data.

In addition to one or more aspects of the system, or as an alternate, when verifying the integrity of the IC array, the controller is configured to perform the steps of: identifying the IC chain that transmitted the unexpected signal from being energized by the radiation event; transmitting an input signal to the IC chain; monitoring for an output signal from the IC chain; and receiving the output signal from the IC chain, thereby verifying the IC chain.

In addition to one or more aspects of the system, or as an alternate, the controller is configured to periodically perform the steps of: setting the WDT to wait for signal anomalies; at the end of a predetermined duration, transmitting the input signal to each of the IC chains in the IC array; monitoring the IC array for the output signal from each of the IC chains, and one of: receiving the output signal from each of the IC chains, thereby verifying each the IC chains; and not receiving the output signal from one or more of the IC chains, thereby failing to verify the one or more of the IC chains and verifying a reminder of the IC chains.

In addition to one or more aspects of the system, or as an alternate, when monitoring for the unexpected data in the test memory, the controller is configured to perform steps of: polling the test memory to obtain polled values, periodically or after receiving the unexpected signal from the IC array; comparing the polled values with previously written values to identify differences, and one of: observing the unexpected data in the memory block by identifying a difference between the polled values and the previously written values, thereby identifying the radiation event; and not observing the unexpected data by not identifying the difference between the polled values and the previously written values, thereby not identifying the radiation event.

In addition to one or more aspects of the system, or as an alternate, upon identifying the radiation event, the controller is further configured to perform steps of: testing an integrity of the test memory; upon verifying the integrity of the test memory, updating memory array counter data in the controller memory corresponding to the memory block exposed to the radiation event, otherwise not updating the memory array counter data.

In addition to one or more aspects of the system, or as an alternate, when verifying the integrity of the test memory, the controller is configured to perform steps of: identifying the memory block that contains the unexpected data, thereby identifying the memory block that was exposed to the radiation event; attempting to rewrite the memory block, and one of: determining that the memory block is capable of being rewritten, thereby verifying the integrity of the test memory; or determining that the memory block is incapable of being rewritten, thereby failing to verify the integrity of the test memory.

In addition to one or more aspects of the system, or as an alternate, the controller is configured to periodically perform steps of: attempting to rewrite all of the memory blocks, and one of: determining that all of the memory blocks are capable of being rewritten, thereby verifying the integrity of the test memory; or determining that one or more of the memory blocks is incapable of being rewritten, thereby failing to verify the integrity of one or more of the memory blocks of the test memory, and verifying a reminder of the memory blocks.

BRIEF DESCRIPTION OF THE DRAWINGS

The present disclosure is illustrated by way of example and not limited in the accompanying figures in which like reference numerals indicate similar elements.

DETAILED DESCRIPTION

A detailed description of one or more embodiments of the disclosed apparatus and method are presented herein by way of exemplification and not limitation with reference to the Figures.

The ability to map radiation exposure on astronomical objects such as the Lunar and Martian surfaces is tantamount to the development of permanent and semi-permanent structures and personnel on such objects. Deploying radiation detection devices across non-terrestrial surfaces is required for such mapping. To reduce a cost and simply manufacturing of such devices, it is desirable to utilize in the detection devices commercial off the shelf (COTS) sensing components, such as active circuits, including but not limited to op-amps, which are non-radiation hardened components, rather than radiation hardened components.

As disclosed in greater detail below, the embodiments provide a radiation detection device that utilizes both radiation hardened (rad-hard) sensing components and non-rad-hard sensing components for the purpose of testing the durability of the non-rad-hard sensing components. Such devices will be placed on astronomical objects and tested for a period of time. The device will help determine how well the non-rad-hard components function from being hit with SEEs over time and their tolerance to total ionization dosage (TID). Should the non-rad-hard components function sufficiently as compared with the rad-hard components, then devices manufactured only with non-rad-hard components, which may be COTS components, may be utilized. Alternatively, utilization of the disclosed device on an astronomical object may result in a determination that radiation exposure from SEEs on certain locations on the astronomical objects requires rad-hard components only or as a backup to the non-rad-hard components.

Figure 1A:
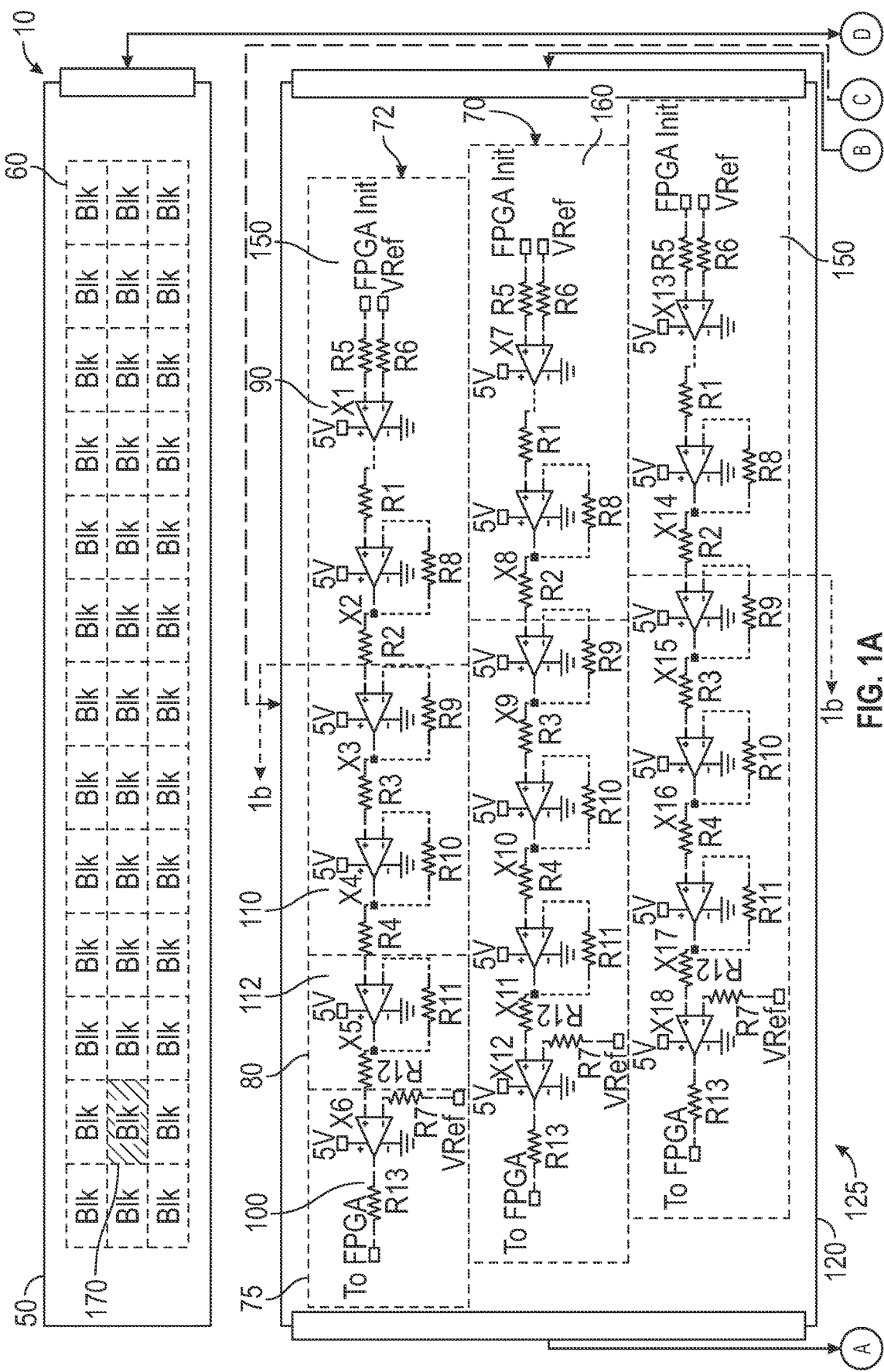
FIG. 1A shows a system for detecting radiation events according to an embodiment.
Figure 1A:
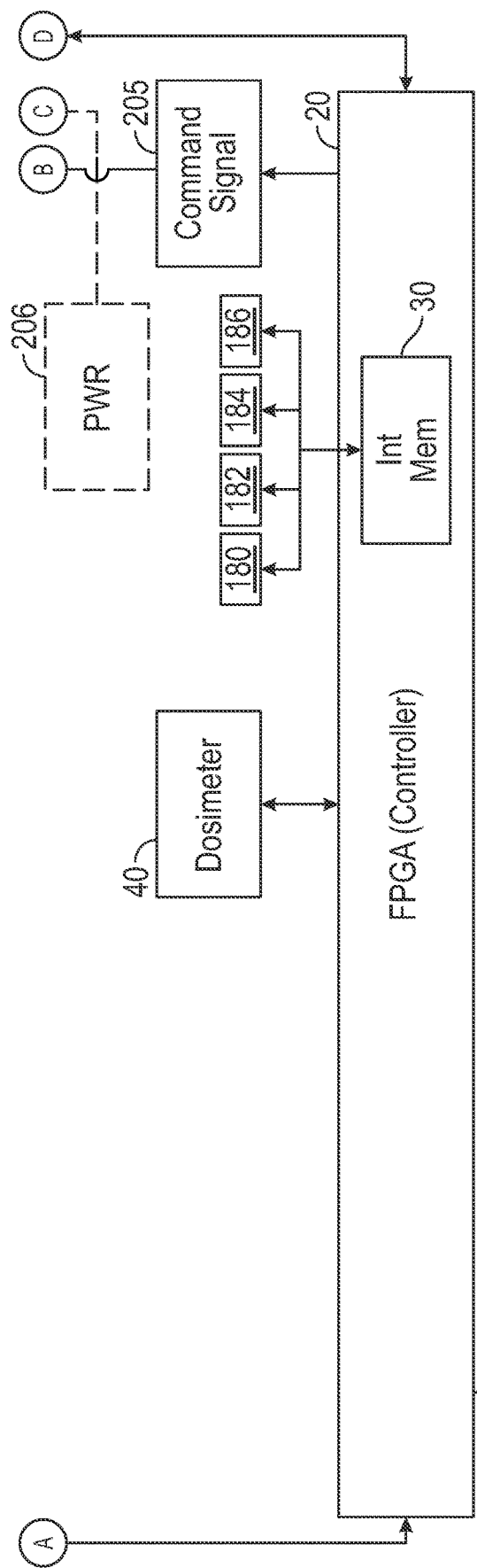

Turning to FIG. 1A, a system 10 (or device) is shown for detecting radiation events, and particularly SEEs. The system 10 includes a controller 20, which may be a field programmable gate array (FPGA), having controller memory 30, which maybe RAM, cache or other memory configured for non-transient storage of information. A dosimeter 40 is configured to record an accumulated amount of radiation exposure to the system 10, i.e., the TID exposure to the system 10.

A test memory 50, which may also be RAM, is included that has a memory block array (or memory blocks) 60, which will be utilized to identify SEEs. An integrated circuit (IC) array 70 is also included having IC chains 72 (e.g., components), which will also be utilized to identify SEEs because they are response to and generate a voltage when exposed to a radiation event such as an SEE. Each of the IC chains 72 has a plurality of IC elements 80. For example, each may have an input comparator 90, an output comparator 100, and a plurality of op-amps configured as buffers 110, connected in series between the input and output comparators 90, 100. The buffers 110 and comparators 90, 100 are powered by a power supply 206 to, e.g., 3.3V, 5V or other desired power, and the comparators are set at, for example, a 50% set-point voltage, referenced from the power supply.

Figure 1B:
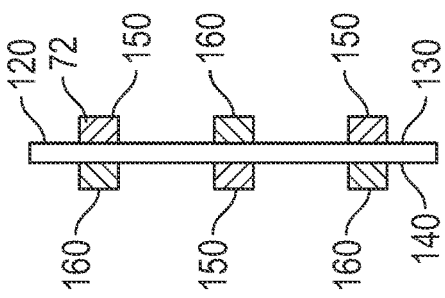
FIG. 1B shows a cross section of the system of FIG. 1, showing an integrated circuit (IC) array on a substrate.

As shown in FIG. 1B, the system 10 includes a substrate 120 having a first side 130 and a second side 140. The IC chains 72 are disposed on both the first side 130 and second side 140 of the substrate 120, which are collectively referred to as a circuit card 125. The IC array 70 includes radiation hardened (rad-hard) IC chains 150 and non-rad-hard IC chains 160 that are positioned on the first side 130 and the second side 140 of the substrate 120. The rad-hard IC chains 150 and the non-rad-hard IC chains 160 alternate, one after another, on each of the sides 130, 140 of the substrate 120. The rad-hard IC chains 150 and the non-rad-hard IC chains 160 also form a first alternating pattern (e.g., rad-hard chain 150, a non-rad-hard chain 160, and a rad-hard chain 150, one after the other) on the first side 130 of the substrate 120 and a second alternating pattern (e.g., non-rad-hard chain 160, a rad-hard chain 150, and a non-rad-hard chain 160, one after the other) on the second side of the substrate 120. The first and second alternating patterns are opposite each other though they may be the same as each other in some embodiments. For example, at any location on one side of the substrate 120 where a non-rad-hard chain 160 is located, the same location on the other side of the substrate 120 will have a rad-hard chain 150. With this configuration, during an SEE, there is a relatively high probability that radiation particles will hit both rad-hard and non-rad-hard chains at the same time. Thus, if the non-rad hard chain fails while the adjacent rad-hard chain survives, a determination can be made that failure is due to the non-rad-hard configuration of the chain.

As disclosed in greater detail below, at initialization, the controller 20 will write data to the controller memory 30, such as all zeros, all ones, or a combination of both.

One way for the controller 20 to determine if an SEE has occurred is by polling the test memory 50. If an SEE hits an individual (or first) block 170 (e.g., an affected memory block) of the test memory 50, that affected memory block 170 should change state from zero to one or vice versa. The controller 20 will poll the memory data periodically, which may be substantially continuously, e.g., at 10 millisecond increments, to see of an unexpected change of state has occurred. The controller 20 will compare polled data with data previously written to identify any difference and determine from that difference that the affected memory block 170 was hit with a radiation particle during an SEE. That is, a block with a "zero" before an SEE may be a "one" after an SEE, or vice versa.

Upon identifying an SEE, the controller 20 will record on the controller memory 30 a data-record 186 that indicates the system was hit by an SEE, by incrementing data in a system counter (or first counter) 180 (FIG. 1a). Further, the controller 20 will poll the dosimeter 40 to identify the TID and record that as well in the data-record 186.

The controller 20 will then attempt to verify the integrity of the affected memory block 170 by rewriting the affected memory block 170, or attempt to verify the integrity of the entire memory by rewriting a larger set, such as all blocks. If the memory blocks 60 are all functioning after an SEE, the controller 20 will record in the data-record 186 that the affected memory block 170 has survived the SEE, by incrementing data in a memory block counter (or second counter 182). Further, the controller 20 will include in the data-record 186 that the affected memory block 170 can withstand the TID polled from the dosimeter 40. This information, together, is indicative of the number of SEE events and TID the affected memory block 170 can withstand.

Alternatively, if the affected memory block 170 is incapable of being rewritten, the controller 20 will not update the counter for it. Instead, the controller 20 will indicate in the stored data-record 186 that the affected memory block 170 failed after the nth SEEs (the prior SEE that hit the affected memory block 170) and the TID associated with the nth SEE that resulted in the failure. This information, together, is indicative of the maximum number of SEE events and TID the affected memory block 170 withstood.

Another way to identify the occurrence of an SEE is to receive a signal from the IC array 70 when an unexpected signal is generated by the IC array 70 due to a SEE. That is, if one of the buffers 112 is hit with a particle from the SEE, and energized from the hit (e.g., an affected buffer), the affected buffer 112 sends a signal down its IC chain 75 (e.g., an affected IC chain) to the output comparator 100, which then is received by the controller 20 from the affected IC chain 75. Upon identifying an SEE, the controller 20 will record on the data-record 186 that indicates the system 10 was hit by an SEE, by incrementing a system counter 180. Further, the controller 20 will poll the dosimeter 40 to identify the TID and record that as well in the data-record 186. From the IC array output signal, the controller 20 may also extrapolate the duration and intensity of the SEE. In comparison, the changed state of any of the memory blocks 60 in the test memory 50 is only evidence of whether the SEE occurred. Duration and intensity would not be obtainable from a binary changed state in a memory block.

The controller 20 will then attempt to verify the integrity of the affected IC chain 75 by energizing it through a known command output signal 205 from the controller 20. If the signal propagates from the initial comparator 90 through the IC chain 75 and returns to the controller 20 from the affected IC chain 75, the controller 20 will record on the data-record 186 that the affected IC chain 75 itself has survived the SEE, by incrementing data in an IC chain counter (or third counter) 184 in its memory. Further, the controller 20 will include in the data-record 186 that the affected IC chain 75 can withstand the TID polled from the dosimeter 40. This information, together, is indicative of the number of SEE events and TID the affected IC chain 75 can withstand.

Alternatively, if the affected IC chain 75 is incapable of sending back an output signal, the controller 20 will not update the counter for it. Instead, the controller 20 will indicate in the data-record 186 that the affected IC chain 75 failed after the nth SEEs (the prior SEE that hit the affected IC chain 75) and the TID associated with the nth SEE that resulted in the failure. This information, together, is indicative of the maximum number of SEE events and TID the affected IC chain 75 withstood.

In addition, upon learning of the SEE from either of the test memory 50 or the IC array 70, the controller 20 will execute an integrity test of the other of these components (e.g., the memory 50 or the IC array 70). The controller 20 may learn about the SEE from one of the components and not the other because the amount of radiation particles, and their paths, associated with an SEE may cause the radiation to hit one of the components and not the other. That is, particles will travel along a path, similar to a laser strike, through the circuit card 125. A chance or likelihood of radiation particles hitting one of the components on the circuit card 125 is related to a layout density of the components on the circuit board 125.

The memory 50 and circuit board 125 are positioned adjacent to each other so that the controller 20 may correlate specific areas of the memory 50 with elements of the IC array 70 on the circuit board 125. If the controller 20 learns of the SEE from the test memory 50, e.g., by finding unexpected data in a memory cell, the controller 20 will scan for a corresponding signal from the IC array 70 within a set time frame, such as but not limited to one second. If there is a corresponding signal from the IC array 70, the controller 20 correlates these two data points, i.e., the unexpected data in the test memory and the signal from the IC array, as a singular SEE. The controller 20 will also check the IC chain 72 corresponding to that area of the memory 50 which implicated an SEE and run a functional check 205 to ensure the path was not destroyed. Alternatively, if the controller 20 learns of the SEE from the IC array 70, e.g., by receiving an unexpected signal, it may attempt to rewrite portions of or the entire test memory 50 to confirm it is functional.

The controller 20 may periodically perform integrity tests of both the test memory 50 and the IC array 70. If the controller 20 performs an integrity test of the test memory 50, it may attempt to rewrite portions of or the entire test memory 50 to confirm it is functional. If the controller 20 performs an integrity test of the IC array 70, it may energize each of the IC chains 72 beginning at comparator 90 to confirm the IC array 70 is fully operational. The frequency at which the integrity tests may be performed on the IC array 70 may also be manually configurable based on environmental pre-existing conditions or extrapolated by the controller 20 during mission duration.

Figure 2:
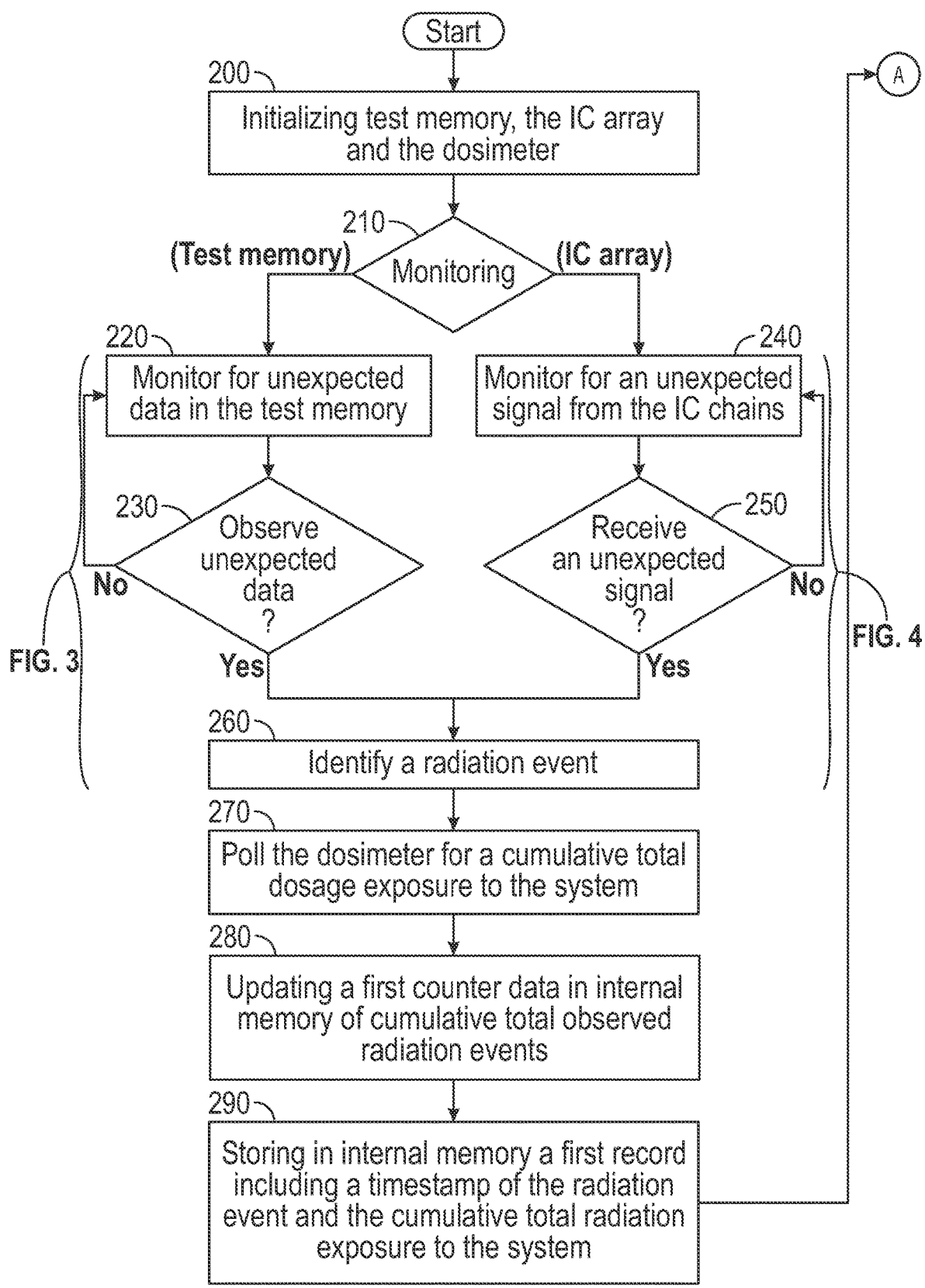
FIG. 2 is a flowchart showing a process of determining that a radiation event occurred and steps taken after the radiation event occurs, according to an embodiment.
Figure 2:
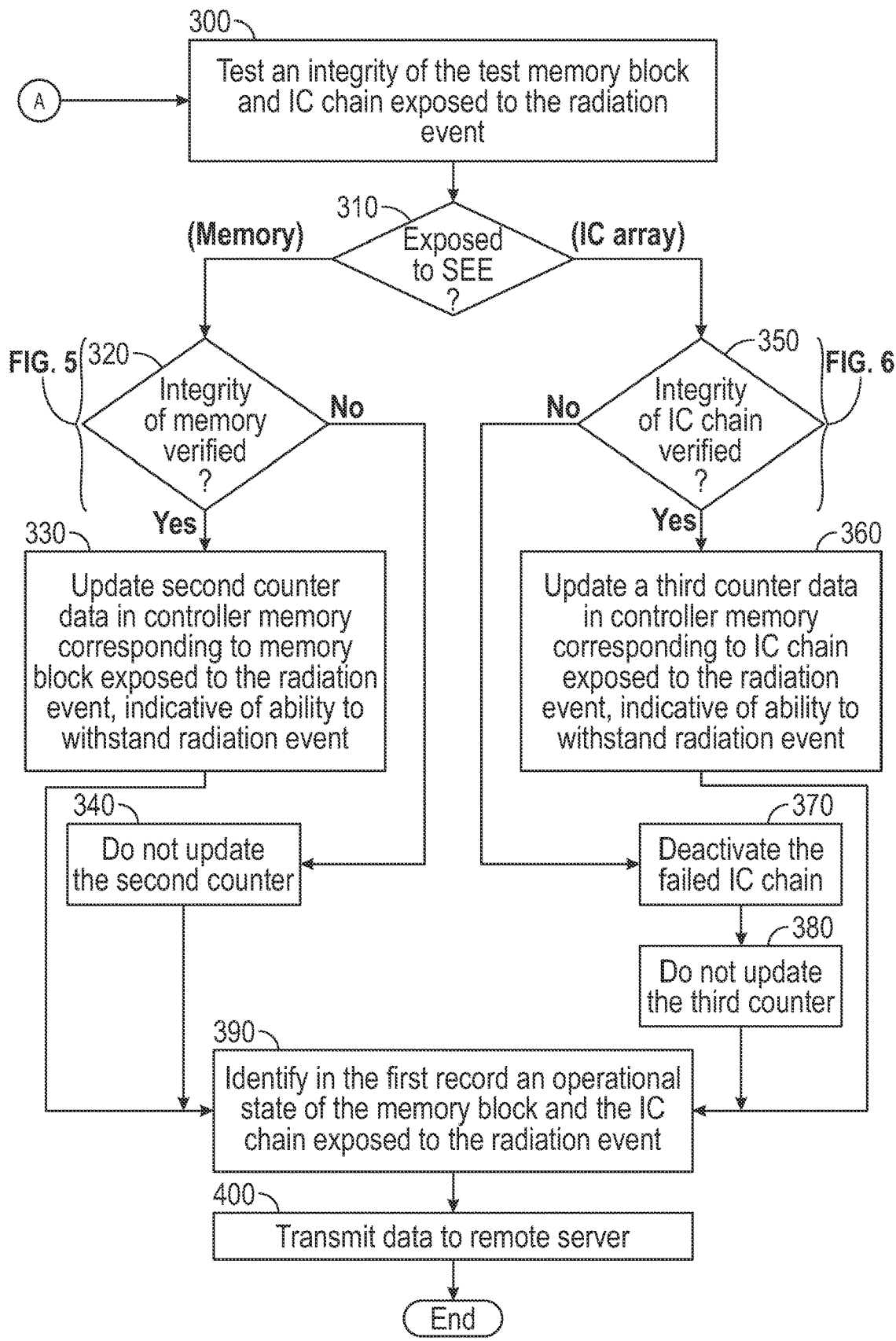

The above operations of the system 10 will now be further addressed with reference to FIGS. 2-8. Turning to FIG. 2, a flowchart shows a process of utilizing the disclosed system 10. As shown in block 200, the process includes the controller 20 initializing the test memory 50, the IC array 70 and the dosimeter 40.

As shown in block 210, the method includes the controller 20 monitoring the IC array 70 and the test memory 50 for an SEE. Monitoring of these components may occur simultaneously, consecutively, or at different intervals from each other. When monitoring the test memory 50 ("test memory" at block 210), as shown in block 220, the system 10 monitors for the unexpected data in a affected memory block 170 of the test memory 50. The monitoring repeats while no unexpected data is observed (No at block 230). Once unexpected data is observed (Yes at block 23), as shown in block 260 the method includes the controller 20 identifying a radiation event. More information about this process shown in FIG. 3 and discussed below.

When monitoring the IC array 70 ("IC array" at block 210), as shown in block 240, the method includes the controller 20 monitoring for the unexpected signal from the IC chains 72. The monitoring repeats while the unexpected signal is not observed (No at block 250). When the unexpected signal is observed (Yes at block 250), as indicated above and shown in block 260 the method includes the controller 20 identifying a radiation event upon observing the unexpected signal. More information about this process shown in FIG. 4 and discussed below.

As shown in block 270, upon identifying the radiation event, the method includes the controller 20 polling the dosimeter 40 for a cumulative total radiation exposure to the system 10. As shown in block 280, the method includes the controller 20 updating the system counter (the first counter 180) in controller memory 30 that counts the cumulative total observed radiation events. As shown in block 290, the method includes the controller 20 storing in controller memory 30 a data-record 186 including a timestamp of the radiation event and the cumulative total radiation exposure to the system 10.

Figure 5:
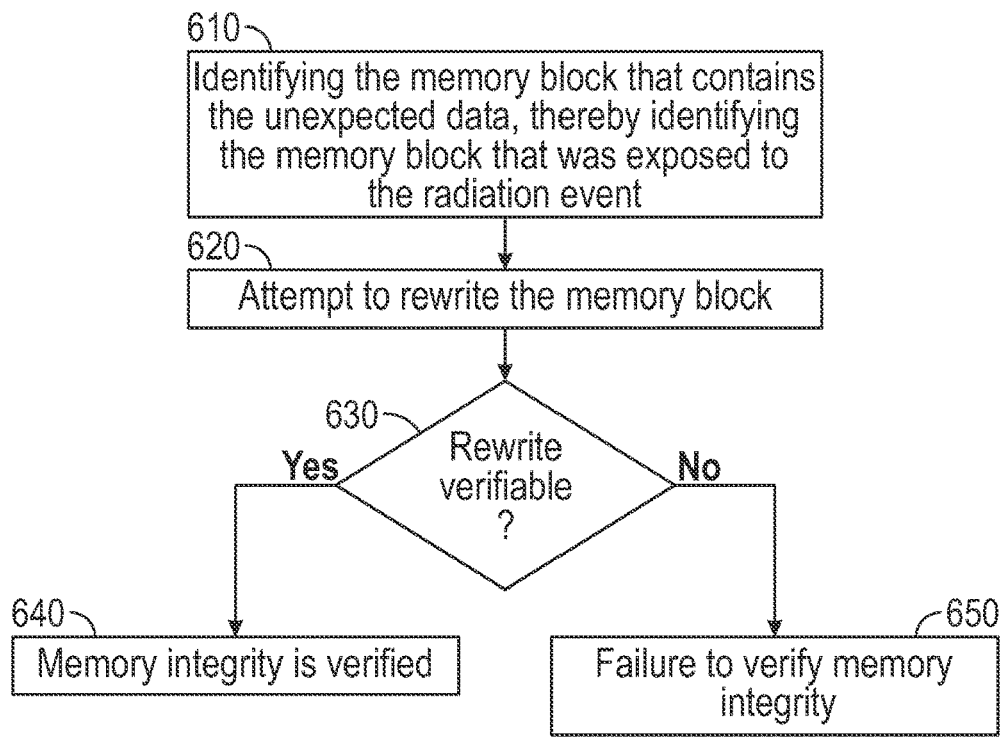
FIG. 5 is a flowchart showing a process for verifying an integrity of the test memory.

As shown in block 300, the method includes the controller 20 testing the integrity of the test memory 50 and the IC array 70, depending on which was exposed to the SEE. If the test memory 50 was exposed to the SEE ("test memory" at block 310), the controller 20 proceeds to test the integrity of the test memory 50. This process is illustrated in FIG. 5 and discussed in greater detail below.

If the controller 20 is able to verify the integrity of the test memory 50 (Yes at block 320), then as shown in block 330, the method includes the controller 20 updating the memory block counter (the second counter 182) for the affected memory block 170. Otherwise if the controller 20 is not able to verify the integrity of the test memory 50 (No a block 320), the controller 20 does not update the counter for the affected memory block 170, as indicated above.

Figure 6:
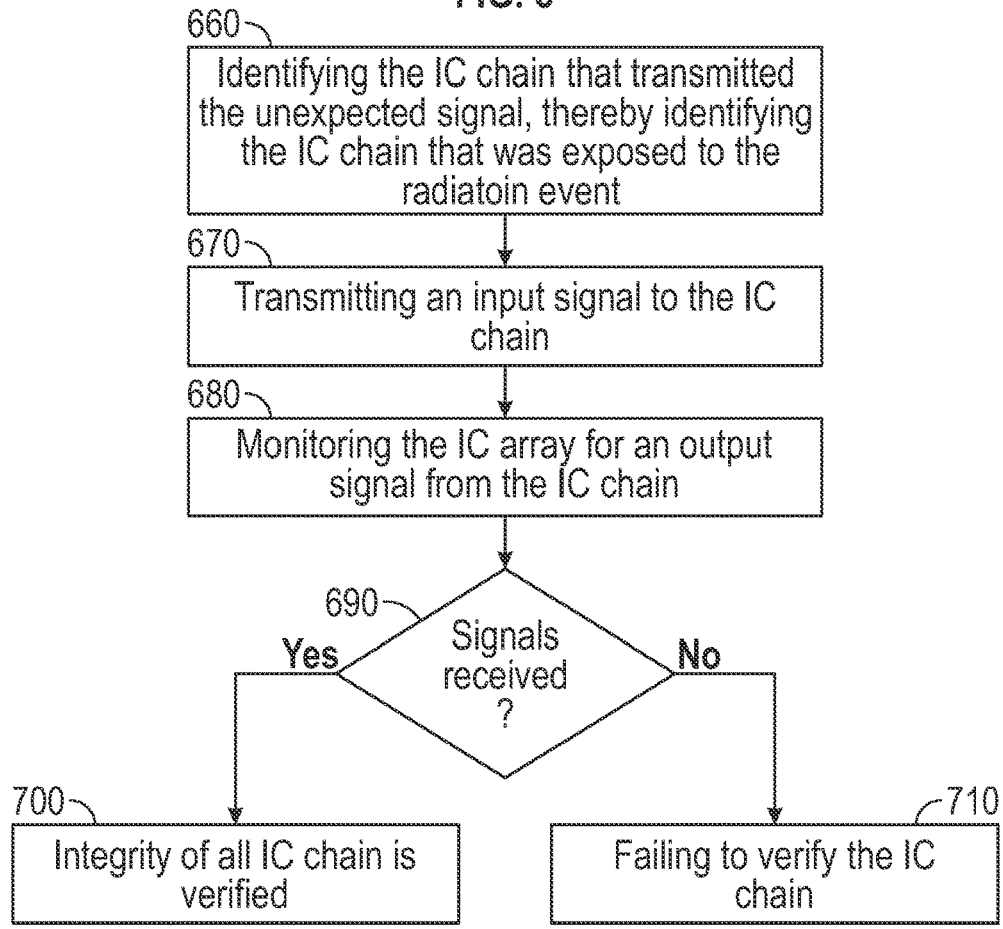
FIG. 6 is a flowchart showing a process for verifying an integrity of the IC array.

If the IC array 70 was exposed to the SEE ("IC array" at block 310), the controller 20 will proceed to test the integrity of the affected IC chain 75, e.g., subject to the SEE. This process is illustrated in FIG. 6 and discussed in greater detail below. If the controller 20 is able to verify the integrity of the affected IC chain 75 (Yes at block 350), then at block 360, the method includes the controller 20 updating the IC chain counter 184 in the controller memory 30 for the affected IC chain 75. If the controller 20 is unable to verify the integrity of the affected IC chain 75 (No at block 350), then at block 370, the controller 20 deactivates the affected IC chain 75. As shown in block 380 the controller 20 does not update the third counter 184.

As shown in block 390 method includes the controller 20 identifying in the data-record 186 an operational state of the affected memory block 170 or the affected IC chain 75 that was exposed to the SEE. It is to be appreciated that if both the affected memory block 170 and affected IC chain 75 presented symptoms of exposure to the SEE (e.g., by unexpected data in the test memory 50 and an unexpected signal from the IC array 70), then the data-record 186 entered by the controller 20 would include the operational state of both the affected memory block 170 and the affected IC chain 75. As shown in block 400 the method includes the controller 20 transmitting the data-record 186, which also includes all of the updated counter data, e.g., identifying the tallies in the first, second and third counters 180-184, to a remote server 215, e.g., on Earth.

Figure 3:
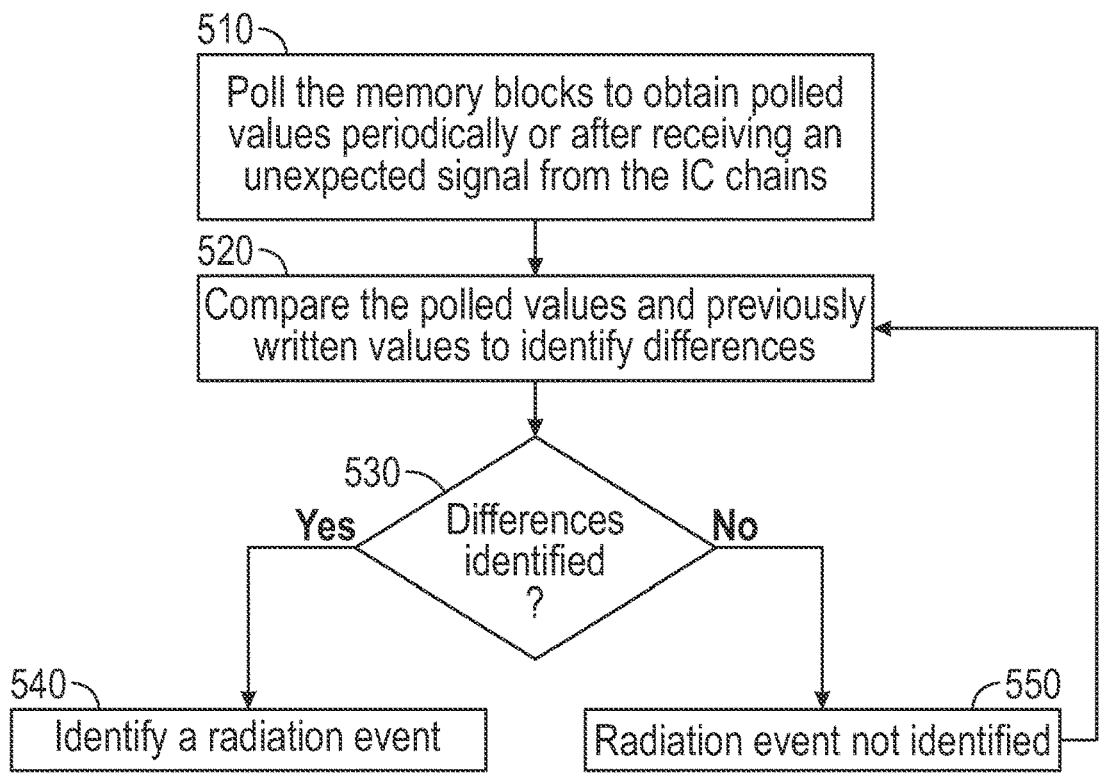
FIG. 3 is a flowchart showing a process of determining that the radiation event occurred from monitoring of memory blocks of a test memory.

Turning to FIG. 3, the method related to monitoring for unexpected data in the test memory 50 includes, as shown in block 510, the controller 20 polling the test memory 50 to obtain polled values. The polling occurs or after receiving the unexpected signal from the IC array 70. As shown in block 520, the method includes the controller 20 comparing the polled values with previously written values to identify differences. If a difference is found (Yes at block 530), then as shown in block 540, the controller 20 determines it has observed the unexpected data in the test memory 50 and, as a result, identified the occurrence of the SEE. If no difference is identified (No at block 530), then as shown in block 550, the controller 20 determines it has not observed the unexpected data in the test memory 50 and, as a result, has not identified the occurrence of the SEE. If no radiation event is observed, then the monitoring will loop by the controller 20 until an SEE is observed, either as indicated from the test memory 50 or the IC array 70.

Figure 4:
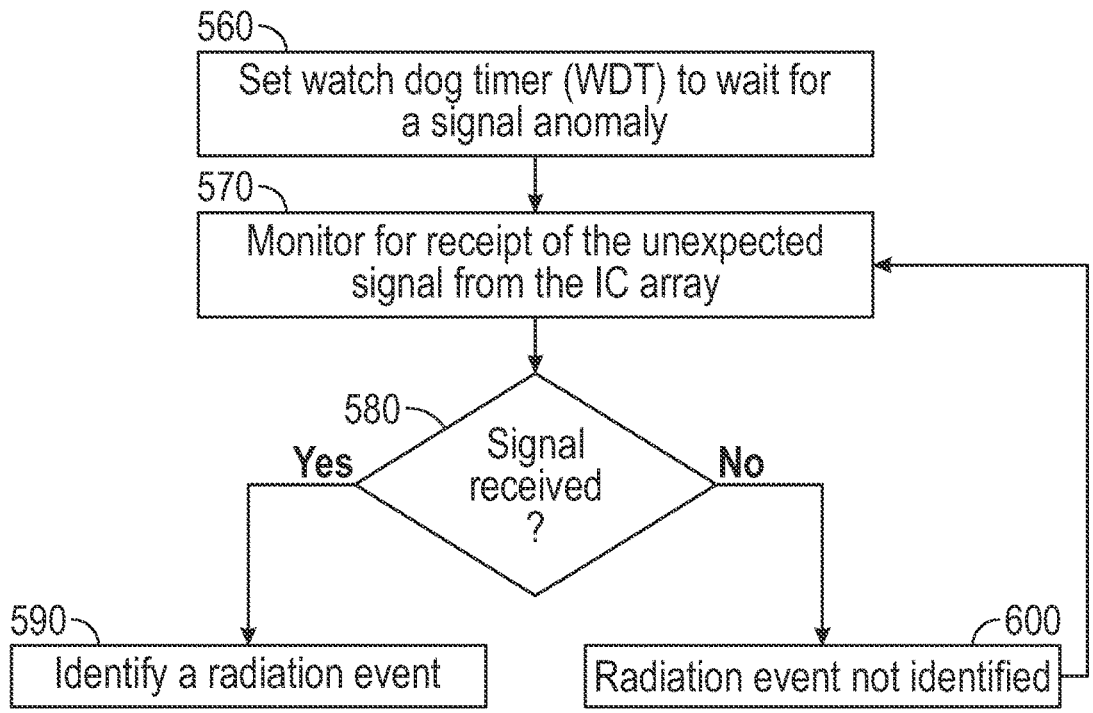
FIG. 4 is a flowchart showing a process of determining that the radiation event occurred from monitoring of an integrated circuit (IC) array.

Turning to FIG. 4, as shown in block 560 the method related to monitoring for an unexpected signal from the IC array 70 includes the controller 20 setting the watch dog timer (WDT) to wait for a signal anomaly. As shown in block 570, the method includes the controller 20 monitoring for receipt of the unexpected signal from the IC array 70. If an unexpected signal is received (Yes at block 580), then as shown in block 590, the method includes the controller 20 determining that the SEE has occurred. If no unexpected signal is received (No at block 580), then as shown in block 600, the method includes the controller 20 determining it has not identified the occurrence of the SEE. If no SEE is observed, then the monitoring will loop until an SEE is observed by the controller 20, either as indicated from the test memory 50 or the IC array 70.

Turning to FIG. 5, the integrity testing of the test memory 50 includes, as shown in block 610, the controller 20 identifying the affected memory block 170 that contains the unexpected data. This identifies the affected memory block 170 that was exposed to the SEE. As shown in block 620, the method includes the controller 20 attempting to rewrite the affected memory block 170, though depending on the executed protocol the controller 20 may attempt to write more blocks than the affected memory block 170. If controller 20 determines it can rewrite the targeted memory blocks (Yes at block 630), then at block 640, the method includes the controller 20 verifying the integrity of the test memory 50. If the controller 20 determines it cannot rewrite the targeted memory blocks (No at block 640), then at block 650, the method includes the controller 20 determining that the affected memory block has failed the integrity test, e.g., it is defective.

Turning to FIG. 6, the integrity testing of the IC array 70 includes, as shown in block 660, the controller 20 identifying the affected IC chain 75 that transmitted the unexpected signal. From this, the controller 20 has identified the affected IC chain 75, e.g., that was exposed to the SEE. As shown in block 670, the method includes the controller 20 transmitting an input signal to the affected IC chain 75. As indicated, under certain protocols, the method may include testing more than one IC chain at this time. As shown in block 680, the method includes monitoring the IC array 70 for an output signal from the affected IC chain 75. If a signal is received (Yes at block 690), then at block 700, the controller 20 determines that the affected IC chain 75 is verified. If a signal is not received (No at block 690), then at block 710, the controller 20 determines that the affected IC chain 75 has failed the integrity test and is damaged.

Figure 7:
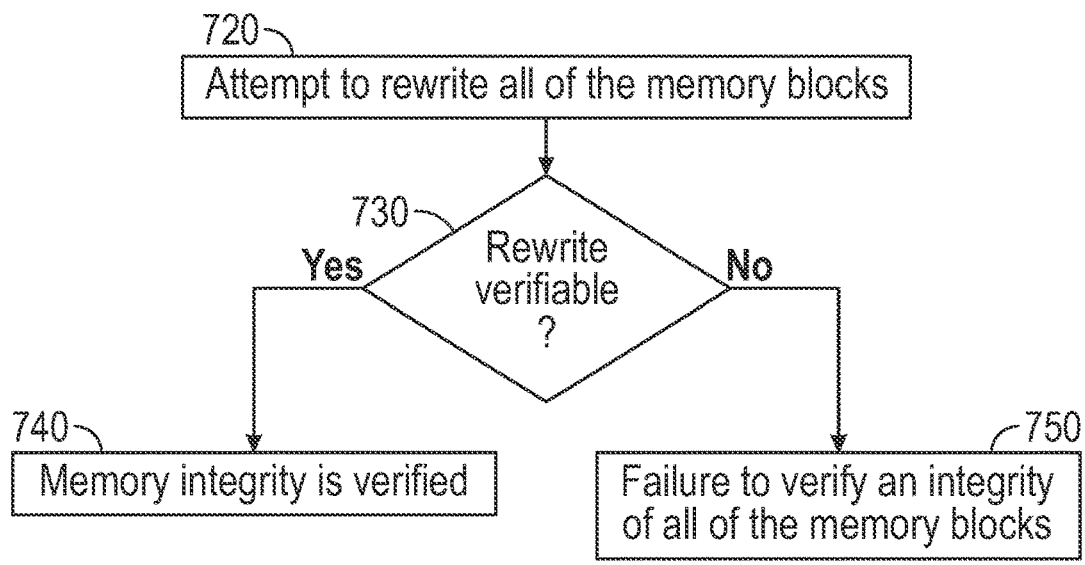
FIG. 7 is a flowchart showing a process for periodically verifying an integrity of the test memory.

Turning to FIG. 7, the controller 20 is also configured to periodically perform integrity tests of the test memory 50. As shown in block 720, the method includes the controller 20 attempting to rewrite all of the memory blocks 60, though the controller 20 may attempt to rewrite fewer than all memory blocks. If the memory blocks are capable of being rewritten (Yes at block 730), then at block 740 the method includes the controller 20 determining that it has verified the integrity of the test memory 50. If one or more of the memory blocks are incapable of being rewritten (No at block 730), then at block 750 the method includes the controller 20 determining that the one or more of the blocks are incapable of being verified but that the remainder of the blocks are verified.

Figure 8:
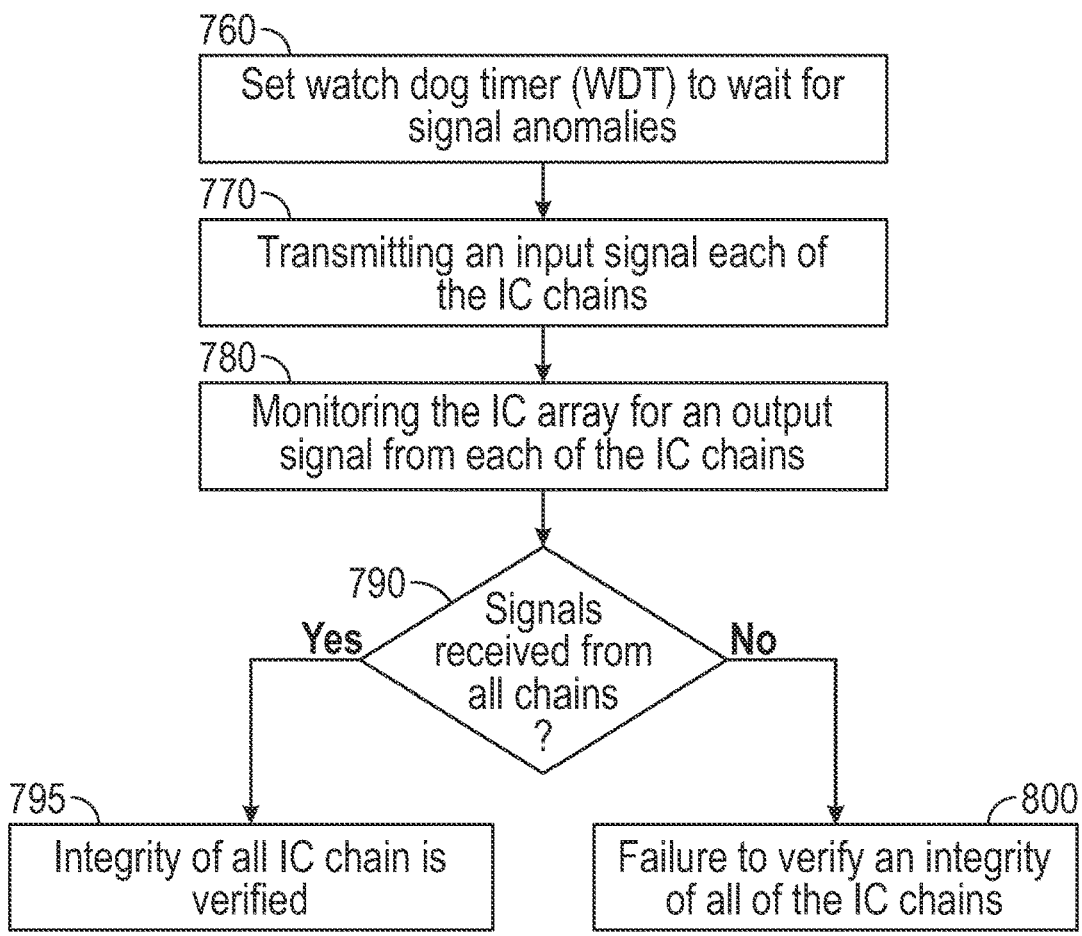
FIG. 8 is a flowchart showing a process for periodically verifying an integrity of the IC array.

Turning to FIG. 8, the controller is also configured to periodically perform the integrity test of the IC array 70. As shown in block 760, the method includes the controller 20 setting the watch dog timer (WDT) to wait for signal anomalies. As shown in block 770, the method includes the controller 20, at the end of a predetermined duration, transmitting an input signal to each of the IC chains 72 in the IC array 70. As shown in block 780, the method includes the controller monitoring the IC array 70 for an output signal from each of the IC chains 72. If output signals are received from each of the IC chains (Yes at block 790), then as shown in block 795, the method include the controller 20 determining that it verified the IC array 70, including all IC chains 72. If output signals are not received from one or more of the IC chains 72 (No at block 790), then at block 800, the controller 20 determines that the one or more of the IC chains 72 cannot be verified and are damaged, and the remaining IC chains 72 are verified.

The disclosed system allows for modular deployment about astronomical objects within a permanent or semi-permanent landed or orbiting unit without relying on on-Earth monitoring and estimation. The system includes an IC array on a substrate, which may be in the form of a modular card, with sensitive electronics that allow for strategic placement of future landing zones or habitats within chosen vehicles or technology. This is because the data can be stored and analyzed to determine if there are consistent or periodic environmental hazards in a particular location. The system integrates into a replaceable structure that can be placed on the surface of, e.g., the Moon, Mars or other astronomical objects, such that expected radiation will affect the device uniformly in a specific orientation. The system utilizes both radiation and non-radiation hardened devices for a space application, that may be in a modular format, that will allow for the determination of whether there is an ability to utilize non-hardened common off the shelf (COTS) electronics rather than hardened electronics in such devices. The ability to characterize the impact of SEEs on both radiation and non-radiation hardened devices will enable for further development of electrical components to test and characterize the hardness criteria of devices.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A system for detecting radiation events, comprising:
a test memory having memory blocks;
a controller having controller memory;
an integrated circuit (IC) array having IC chains, wherein each of the IC chains has a plurality of IC elements that is response to and generates a voltage when exposed to a radiation event;
a dosimeter configured to record an accumulated amount of radiation exposure to the system,
wherein the controller is configured to perform steps of:
   initializing the test memory, the IC array and the dosimeter;
   monitoring for an unexpected signal from an IC chain and for unexpected data in a memory block of the test memory; and
   identifying the radiation event upon one or more of receiving the unexpected signal and identifying unexpected data in a memory block of the test memory.

2. The system of claim 1, wherein each of the IC chains includes:
an input comparator;
an output comparator; and
a plurality of buffers connected in series between the input and output comparators.

3. The system of claim 1, further comprising:
a substrate having first and second sides, and
wherein the IC chains are disposed on the first and second sides of the substrate.

4. The system of claim 3, wherein:
the IC array include radiation hardened (rad-hard) IC chains and non-rad-hard IC chains that are positioned on the first and second sides of the substrate.

5. The system of claim 4, wherein:
the rad-hard IC chains and the non-rad-hard IC chains alternate at least on a first side of the substrate.

6. The system of claim 5, wherein:
the rad-hard IC chains and the non-rad-hard IC chains are configured in a first alternating pattern on the first side of the substrate and a second alternating pattern on the second side of the substrate, where the first and second alternating patterns are either opposite each other or are the same as each other.

7. The system of claim 1, wherein upon identifying the radiation event, the controller is configured to perform steps of:
polling the dosimeter for a cumulative total radiation exposure to the system;
updating system counter data in the controller memory to a cumulative total observed radiation events; and
storing in the controller memory a data-record including a timestamp of the radiation event and the cumulative total radiation exposure to the system.

8. The system of claim 7, wherein when monitoring for unexpected signals from the IC array, the controller is configured to perform steps of:
setting a watch dog timer (WDT) to wait for signal anomalies; and
monitoring for receipt of the unexpected signal from the IC array.

9. The system of claim 8, wherein upon identifying the radiation event, the controller is configured to perform steps of:
testing an integrity of the IC array; and
upon verifying the integrity of the IC array, updating an IC array counter data in the controller memory corresponding to the IC chain exposed to the radiation event, otherwise deactivating the IC chain exposed to the radiation event, and not updating the IC array counter data.

10. The system of claim 9, wherein when verifying the integrity of the IC array, the controller is configured to perform the steps of:
identifying the IC chain that transmitted the unexpected signal from being energized by the radiation event;
transmitting an input signal to the IC chain;
monitoring for an output signal from the IC chain; and
receiving the output signal from the IC chain, thereby verifying the IC chain.

11. The system of claim 10, wherein the controller is configured to periodically perform the steps of:
setting the WDT to wait for signal anomalies;
at the end of a predetermined duration, transmitting the input signal to each of the IC chains in the IC array;
monitoring the IC array for the output signal from each of the IC chains, and
one of:
receiving the output signal from each of the IC chains, thereby verifying each the IC chains; and
not receiving the output signal from one or more of the IC chains, thereby failing to verify the one or more of the IC chains and verifying a reminder of the IC chains.

12. The system of claim 1, wherein when monitoring for the unexpected data in the test memory, the controller is configured to perform steps of:
polling the test memory to obtain polled values, periodically or after receiving the unexpected signal from the IC array;
comparing the polled values with previously written values to identify differences, and
one of:
observing the unexpected data in the memory block by identifying a difference between the polled values and the previously written values, thereby identifying the radiation event; and
not observing the unexpected data by not identifying the difference between the polled values and the previously written values, thereby not identifying the radiation event.

13. The system of claim 12, wherein upon identifying the radiation event, the controller is further configured to perform steps of:
testing an integrity of the test memory;
upon verifying the integrity of the test memory, updating memory array counter data in the controller memory corresponding to the memory block exposed to the radiation event, otherwise not updating the memory array counter data.

14. The system of claim 13, wherein when verifying the integrity of the test memory, the controller is configured to perform steps of:
identifying the memory block that contains the unexpected data, thereby identifying the memory block that was exposed to the radiation event;
attempting to rewrite the memory block, and
one of:
determining that the memory block is capable of being rewritten, thereby verifying the integrity of the test memory; or
determining that the memory block is incapable of being rewritten, thereby failing to verify the integrity of the test memory.

15. The system of claim 1, wherein the controller is configured to periodically perform steps of:
attempting to rewrite all of the memory blocks, and
one of:
determining that all of the memory blocks are capable of being rewritten, thereby verifying the integrity of the test memory; or
determining that one or more of the memory blocks is incapable of being rewritten, thereby failing to verify the integrity of one or more of the memory blocks of the test memory, and verifying a reminder of the memory blocks.

* * * * *